(12) United States Patent
Rutter et al.

(10) Patent No.: US 8,652,904 B2
(45) Date of Patent: Feb. 18, 2014

(54) SEMICONDUCTOR DEVICE WITH GATE TRENCH

(75) Inventors: Philip Rutter, Stockport (GB);
Christopher Martin Rogers, Manchester (GB)

(73) Assignee: NXP, B.V., Eindhoven (NL)

( * ) Notice: Subject to any disclaimer, the term of this patent is extended or adjusted under 35 U.S.C. 154(b) by 217 days.

(21) Appl. No.: 13/237,878

(22) Filed: Sep. 20, 2011

(65) Prior Publication Data

US 2012/0070983 A1 Mar. 22, 2012

(30) Foreign Application Priority Data

Sep. 21, 2010 (EP) .................................... 10178090

(51) Int. Cl.
*H01L 21/336* (2006.01)
(52) U.S. Cl.
USPC ........... 438/270; 438/259; 438/587; 438/588; 438/589; 438/648
(58) Field of Classification Search
USPC .......................... 438/259, 270, 587–589, 648
See application file for complete search history.

(56) References Cited

U.S. PATENT DOCUMENTS

| 7,049,668 | B1 | 5/2006 | Hshieh | |
|---|---|---|---|---|
| 2004/0056302 | A1 | 3/2004 | Grebs et al. | |
| 2008/0121986 | A1* | 5/2008 | Hshieh | 257/328 |
| 2008/0308893 | A1* | 12/2008 | Kirby et al. | 257/459 |
| 2009/0014787 | A1* | 1/2009 | Wang | 257/331 |
| 2010/0176445 | A1* | 7/2010 | Hsieh | 257/331 |
| 2011/0169075 | A1* | 7/2011 | Hsieh | 257/330 |
| 2011/0291183 | A1* | 12/2011 | Lin et al. | 257/330 |
| 2012/0037954 | A1* | 2/2012 | Hshieh | 257/139 |

OTHER PUBLICATIONS

Extended European Search Report for Patent Appln. No. 10178090.6 (Mar. 28, 2011).

* cited by examiner

*Primary Examiner* — Bac Au

(57) ABSTRACT

A method of manufacturing a semiconductor device is presented. The device has: a gate terminal formed from polysilicon and covered by an insulation layer; and a plug extending through an insulation layer to provide an electrical connection to the gate trench. A metal layer is deposited to cover at least a portion of the insulation layer. The metal layer is then etched to remove the metal layer from above the plug.

20 Claims, 3 Drawing Sheets

SEMICONDUCTOR DEVICE WITH GATE TRENCH

CROSS-REFERENCE TO RELATED APPLICATIONS

This application claims the priority under 35 U.S.C. §119 of European patent application no. 10178090.6, filed on Sep. 21, 2010, the contents of which are incorporated by reference herein.

The invention relates to a semiconductor device having a gate trench and, more particularly, to a method of making the same.

A gate finger refers to a single gate structure of a Field Effect Transistor (FET), and most FETs have multiple gate fingers or gate structures.

The gate bus-bar is the electrical contact that is used to connect multiple gate structures or fingers together. A gate ring is a gate bus bar which extends around the outside of a semiconductor device and may form part of the edge termination of the device. Gate bus-bars may then be used to provide electrical contacts from the gate ring to the gates in the active area of the device.

Gate resistance (Rg) is a parasitic element that affects the switching speed and uniformity of switching of a FET, and is inversely proportional to the cross-sectional area of conductor along the gate finger and proportional to the length of the finger.

The addition of gate bus-bars is an effective way of reducing Rg but these structures increase active area usage and thus increase die area.

There have been concerns over the reliability of bus-bars when a connection between the source metal and the package (for example a copper clip) is place over the bus-bar. One such concern has been that the gate bus-bar metal profile could contribute to cracking of the passivation layer increasing the probability of gate bus-bar short circuits.

Removal of the gate bus-bar has been considered but this has been shown to significantly increase Rg and so is not practical. For example, in a design with a single central bus-bar, its removal would increase Rg by a factor of 3 to 4. Using a polysilicon only bus-bar also results in an unacceptably high Rg due to the high sheet resistance of polysilicon.

According to the invention, there is provided a method of manufacturing a semiconductor device with a gate trench according to claim 1.

Embodiments may provide an insulator topography that is flatter than conventional FETs and less susceptible to passivation layer cracking and/or shorting above the bus-bar. Also, the top electrical contact layer may be applied across the bus-bar with a reduced risk of cracking. This may be advantageous for devices having a small source clip that would otherwise prevent the use of a bus-bar without a continuous top contact layer covering the bus-bar.

Thus, for semiconductor devices where it is not possible or practical to have a metal layer (such as an Aluminium metallisation layer) connecting to a bus-bar (or gate ring) due to area constraints or reliability concerns due to the use of a source connection clip, Rg can be improved by make use of a tungsten plug which contacts a gate trench of the device. This may be achieved using standard processing steps and may only require minor modification to device layout. Furthermore, such a concept may be employed for every gate stripe to significantly reduce gate resistance.

For a better understanding of the invention, embodiments will now be described, purely by way of example, with reference to the accompanying drawings, in which:

FIG. 3 shows a sectional view of a VFET according to another embodiment of the invention; and.

The same reference numbers are used for the same or corresponding features in the various figures and the description relating to these features is not necessarily repeated. The figures are schematic and not to scale.

Proposed is the creation of a narrow flat polysilicon bus-bar with low resistance through the use of a tungsten-plug that is present in conventional FETs and a novel design.

Figure 1:
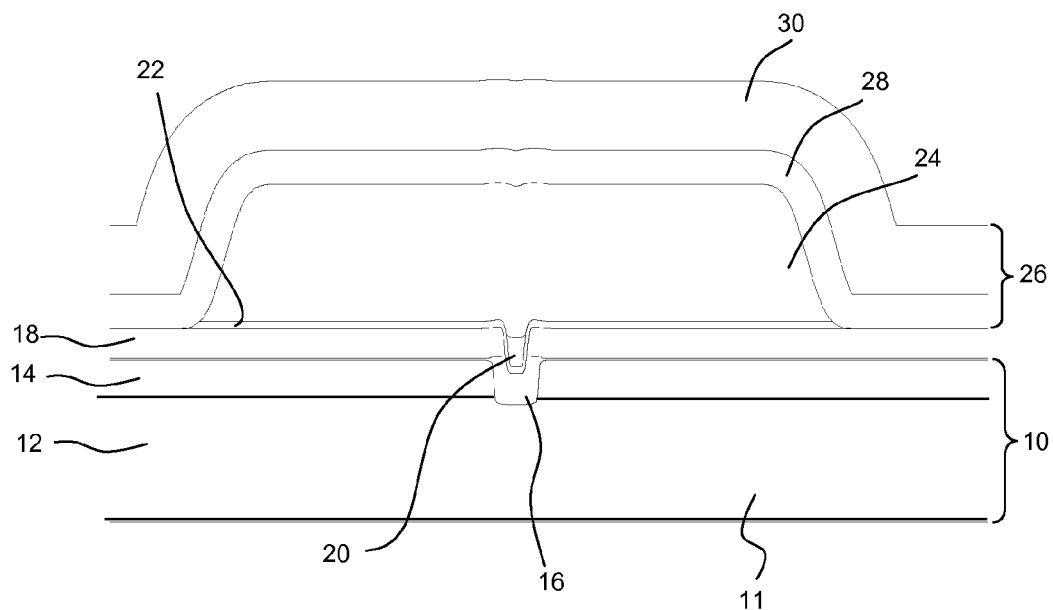
FIG. 1 shows a sectional view of the construction of a gate bus-bar in a conventional VFET where the bus-bar is contacting directly into the gate trench network.

FIG. 1 illustrates a sectional view of a conventional gate bus-bar in a vertical field effect transistor (VFET). The manufacture of the VFET that would use the bus-bar construction of FIG. 1 is relatively standard and so will not be described in full detail. In particular, the formation of a VFET with a gate trench, body, source and drain is known.

The substrate structure 10 of the VFET includes a semiconductor substrate 11 with a drift layer 12 formed thereon and a body layer 14 formed on the upper surface of layer 12. The substrate structure 10 is formed of doped semiconductor material so as to be electrically conductive. Here, substrate 11 is a relatively heavily doped silicon (Si) substrate, in this case n-F Phosphourous doped (although other n-type of p-type dopants can be used). The drift layer 12 is a lighter n-type doped-Si. Body layer 14 is doped to the inverse polarity of the drift and substrate regions.

A gate trench 16 extends downwardly through the body layer 14 into the drift layer 12 and is filled with polysilicon. The gate polysilicon (either stripes or other geometries) feed into the 'contact' gate trench. Alternatively, the gate polysilicon can extend out of the gate trench onto the silicon surface (but be separated physically from the Si by an insulating layer) with the metal contact being formed on the polysilicon residing on the silicon surface.

Provided on top of the substrate structure 10, covering the body layer 14 and the trench 16, is an insulating TEOS layer 18. A tungsten plug 20 extends through the TEOS layer 18 to provide an electrical contact to the polysilicon trench 16. However, it is noted that a Ti and TiN barrier layer 22 is provided on top of the TEOS layer 18 and between the tungsten plug 20 and the polysilicon trench 16.

An Aluminium (Al) contact layer 24 is provided on the barrier layer 22 and the tungsten plug 20 so as to provide a large electrical contact for tungsten plug 20. A passivating structure 26 covers the VFET and includes one or more layers which may include an oxide layer 28 with a SiN layer 30 formed thereon.

It will be understood that the VFET of FIG. 1 has a gate bus-bar with a contact into a wide trench that the gate stripes connect into. In other words, FIG. 1 illustrates the bus-bar and shows the wide trench that the fingers run into Turning now to FIG. 2, there is illustrated a sectional view of a VFET bus-bar according to an embodiment of the invention. It will be seen that the VFET of FIG. 2 is similar to that of FIG. 1 except that the aluminium contact layer 24 and the barrier layer 22 above the tungsten plug 20 has been removed (using an Al etching process to remove the aluminium 24 followed by a barrier etch to remove the barrier layer 22).

It will be appreciated that, in this example, the barrier etch is adapted to remove the TiN barrier layer 22. However, other barriers could be used and, in other embodiments, the W-Plug may not be planarised.

It is noted that there may be some recessing of the tungsten plug 20 due to erosion during the barrier etch. A layer of Aluminium may therefore be left in this recess covering the tungsten plug 20 but not the TEOS layer (as illustrated in FIG. 2). However, it should also be noted that the Figures are not necessarily to scale.

Figure 2:
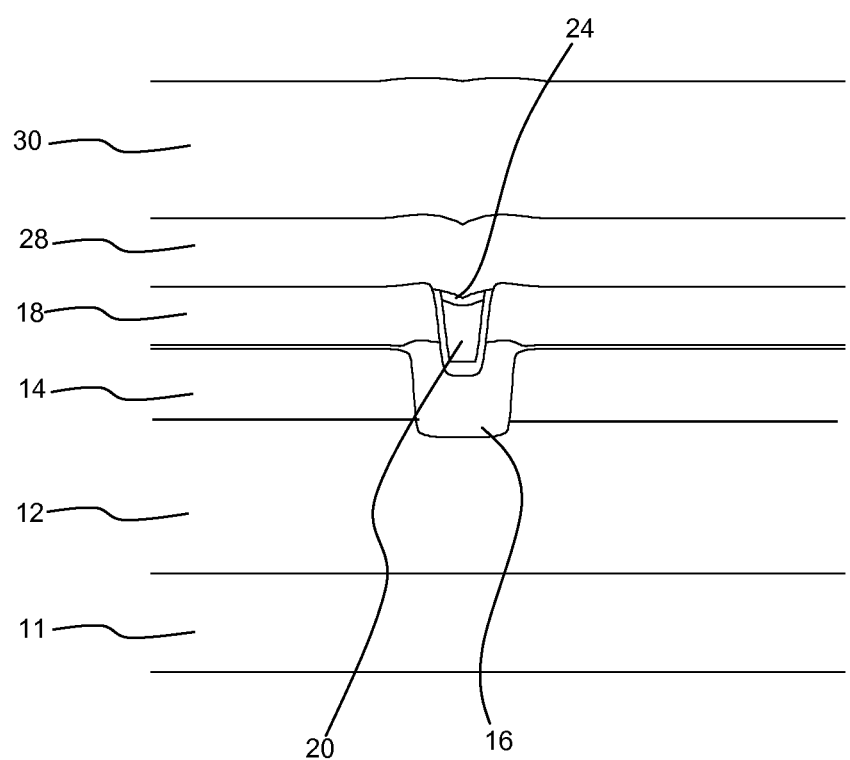
FIG. 2 shows a sectional view of a VFET according to an embodiment of the invention.

Accordingly, the manufacturing process of the VFET of FIG. 2 is similar to that of FIG. 1 except that it comprises the additional step of removing the metal contact layer(s) provided above and in contact with the Tungsten plug contact 20.

The resistivity of the Tungsten may be approximately 100 times smaller than that of the polysilicon gate trench 16. For example, the resistivity of Tungsten at room temperature is approximately 5.6 μΩcm, whilst the resistivity of polysilicon may be in the range of 500-800 μΩcm (depending on factors such as the grain size, etc.). In proposed embodiments, the Tungsten plug 20 may have a cross-sectional area that is around five times smaller (i.e. 20%) than that of the gate trench 16, resulting in the resistance of a stripe of tungsten plug being approximately twenty (20) times lower than that of the wide polysilicon gate trench 16.

A further improvement can be made by using a second barrier photolith prior to the Ti/TiN/W barrier metal etch having previously left the W layer 32 unplanarised—this will protect the W plug and provide for an even lower resistance by allowing a Ti/TiN/W region to extend from the contact hole onto the TEOS surface.

Figure 3:
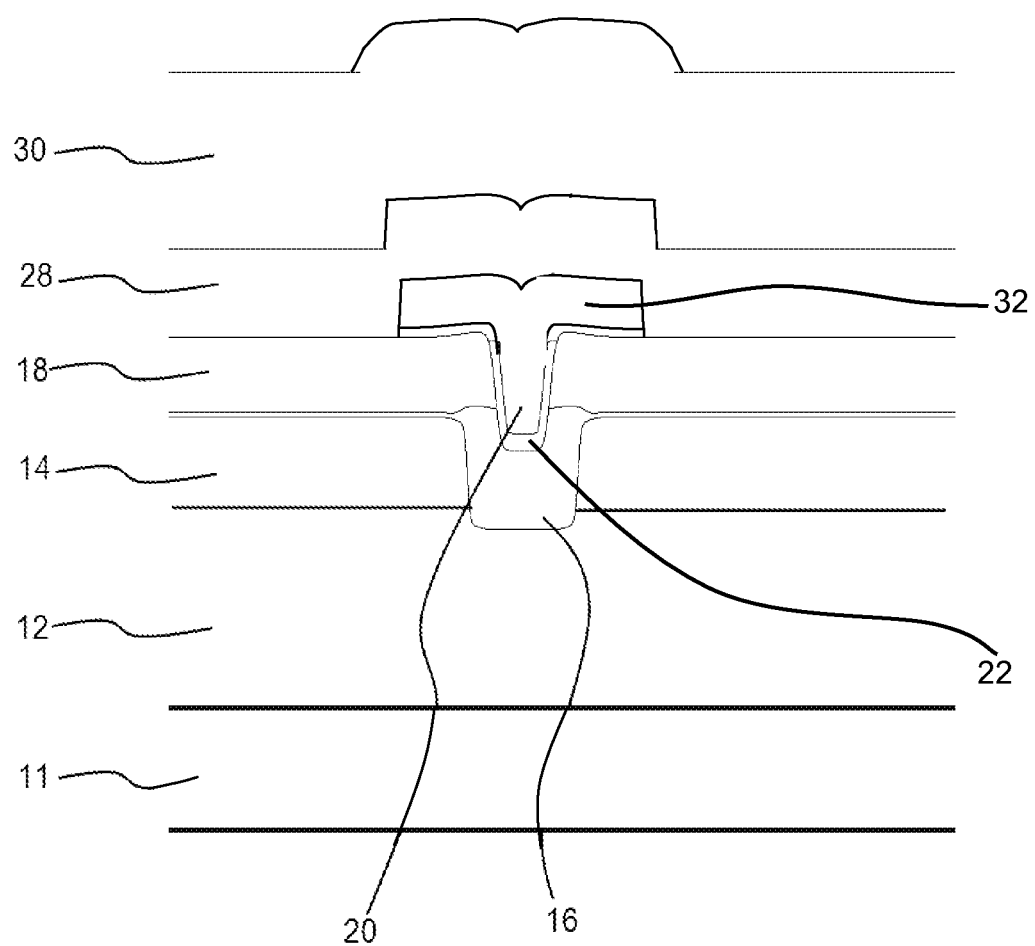

For example, such an embodiment is shown in FIG. 3.

In the conventional structure shown in FIG. 1, prior to the Al etch, the photolith process would leave some resist in place in the areas where the Al contact layer 24 and barrier layer 22 is desired to remain. In this further embodiment, however, the photomask is modified so that there is no resist left in the bus-bar area. In this way, after the Al etch, the Al layer 24 is removed in the whole of the bus bar area and the Ti/TiN layer 22 and the W layer 32 remain everywhere. It will be understood, that if one was to then undertake an etch of the Ti/TiN/W layers at this point, the barrier layers 22 and 32 would be removed to leave a structure like that of FIG. 2.

If however, before the barrier etch, a resist layer is placed where the barrier layers 22 and 32 are desired to remain (for example, in the same location as if making the structure of FIG. 1), after barrier etching (and removing the photo resist) then we end up with FIG. 3.

It should be understood that, in alternative embodiments, the polysilicon of the gate may extend beyond the lateral extent of the gate trench. In such cases, the plug may be adapted to contact the polysilicon outside of the gate trench (i.e. beyond the lateral extent of the gate terminal). Thus, the layer used to form the plug may extend beyond the lateral extent of the gate trench (which the poly being planarised).

It is noted that, because the bus-bar construction of embodiments may be narrow, further improvements in Rg may be obtained by using many of these bus-bar structures in parallel with periodic trench interconnects between them.

This may also be extended to providing a plug into every trench stripe, therefore removing the need for metal bus-bars and providing very low Rg.

It will be appreciated that available lithography and plug technology may, in practicality, set a limit on the minimum trench width that can be used, which may mean sacrificing cell pitch for low Rg. In this case, the processing may be more complex due to the need to isolate the poly plug from the source metal with a second dielectric deposition. This second dielectric layer may only be deposited with PECVD or a similar oxide as the maximum temperature should not exceed the point at which the TiN barrier layer under the tungsten plug is disrupted (short time at 450 deg C).

Those skilled in the art will realise that modifications are possible. For example, the term "metal" in the terms "source metal" and "gate metal" is not intended to exclude metallic, conductive arrangements that are not strictly speaking pure metal.

The invention claimed is:

1. A method of manufacturing a semiconductor device, the method comprising:
   forming a gate terminal from polysilicon;
   forming an insulation layer that covers the gate terminal;
   forming a plug that extends through the insulation layer to provide an electrical connection to the gate terminal;
   depositing a metal layer which covers at least a portion of the insulation layer and is located above the plug; and
   etching the metal layer to remove the metal layer from directly above the plug.

2. The method of claim 1, wherein the gate terminal is formed within a gate trench and wherein the plug is formed from tungsten.

3. The method of claim 2, wherein the plug contacts the gate terminal within the gate trench.

4. The method of claim 2, further comprising the step of patterning the tungsten used to form the plug so that the plug extends beyond the lateral extent of the gate terminal.

5. The method of claim 1, further comprising the step of planarising the plug.

6. The method of claim 1, wherein the polysilicon extends beyond the lateral extent of the gate terminal and wherein the plug contacts the polysilicon extending beyond the lateral extent of the gate terminal.

7. The method of claim 1, wherein the metal layer comprises aluminum and the step of etching comprises wet etching the metal layer.

8. The method of claim 1, further comprising the step of forming a Ti-based barrier layer between the plug and the gate terminal.

9. The method of claim 1, wherein the insulation layer is a TEOS layer.

10. A method of manufacturing a semiconductor device, the method comprising:
    forming a gate terminal from polysilicon;
    forming an insulation layer that covers the gate terminal;
    forming a tungsten plug that extends through the insulation layer to provide an electrical connection to the gate terminal;
    depositing an aluminum contact layer which covers at least a portion of the insulation layer and is located above the tungsten plug; and
    etching the aluminum contact layer to remove the aluminum contact layer from directly above the tungsten plug.

11. The method of claim 10, wherein the aluminum contact layer is a top electrical contact layer that is deposited directly on top of the tungsten plug.

12. The method of claim 10, further comprising the step of planarising the tungsten plug.

13. The method of claim 12, wherein the tungsten plug contacts the gate terminal within a gate trench, the gate terminal formed within the gate trench.

14. The method of claim 10, wherein the polysilicon extends beyond the lateral extent of the gate terminal and wherein the tungsten plug contacts the polysilicon extending beyond the lateral extent of the gate terminal.

15. The method of claim 10, further comprising the step of patterning the tungsten used to form the tungsten plug so that the tungsten plug extends beyond the lateral extent of the gate terminal.

16. A method of manufacturing a semiconductor device, the method comprising:
   forming a gate terminal from polysilicon;
   forming an insulation layer that covers the gate terminal;
   forming a tungsten plug that extends through the insulation layer to provide an electrical connection to the gate terminal;
   depositing a top electrical contact layer which covers at least a portion of the insulation layer and is located above the tungsten plug; and
   etching the top electrical contact layer to remove the top electrical contact layer from directly above the tungsten plug.

17. The method of claim 16, wherein the top electrical contact layer comprises aluminium and the step of etching comprises wet etching the top electrical contact layer.

18. The method of claim 17, wherein the tungsten plug contacts the gate terminal within a gate trench, the gate terminal formed within the gate trench.

19. The method of claim 18, wherein the polysilicon extends beyond the lateral extent of the gate terminal and wherein the tungsten plug contacts the polysilicon extending beyond the lateral extent of the gate terminal.

20. The method of claim 18, further comprising the step of patterning the tungsten used to form the tungsten plug so that the tungsten plug extends beyond the lateral extent of the gate terminal.

\* \* \* \* \*